United States Patent

Takagi

[11] Patent Number: 5,870,198
[45] Date of Patent: Feb. 9, 1999

[54] STAGE POSITION MEASURING APPARATUS CAPABLE OF RESTRICTING GENERATION OF TEMPERATURE FLUCTUATIONS TO A MEASURED VALUE

[75] Inventor: Shinichi Takagi, Kanagawa-ken, Japan

[73] Assignee: Nikon Corporation, Tokyo, Japan

[21] Appl. No.: 935,932

[22] Filed: Sep. 23, 1997

Related U.S. Application Data

[63] Continuation of Ser. No. 521,063, Aug. 29, 1995, abandoned.

[30] Foreign Application Priority Data

Aug. 30, 1994 [JP] Japan ............................. 6-228817

[51] Int. Cl.⁶ ........................................... G01B 9/02
[52] U.S. Cl. ............................................. 356/358
[58] Field of Search ............................ 356/358, 363, 356/401; 250/548; 355/30, 53

[56] References Cited

U.S. PATENT DOCUMENTS

| | | | |
|---|---|---|---|
| 4,786,947 | 11/1988 | Kosugi et al. | 355/30 |
| 4,814,625 | 3/1989 | Yabo | 356/358 |
| 5,141,318 | 8/1992 | Miyazaki et al. | 356/358 |
| 5,146,284 | 9/1992 | Tabarelli et al. | 356/358 |
| 5,392,120 | 2/1995 | Kamiya | 356/358 |
| 5,469,260 | 11/1995 | Takagi et al. | 356/358 |
| 5,550,633 | 8/1996 | Kamiya | 356/358 |

FOREIGN PATENT DOCUMENTS 1-274001  1/1989  Japan.
5-126522  5/1993  Japan.

*Primary Examiner*—Samuel A. Turner
*Attorney, Agent, or Firm*—Armstrong, Westerman, Hattori, McLeland & Naughton

[57] ABSTRACT

A stage position measuring apparatus according to the present invention comprises a movable stage being mounted within a chamber, a system for optically measuring an position of the stage, a system for general air-conditioning of an atmosphere within the chamber, a system for locally air-conditioning an optical path of the measuring system, and a system for controlling the local air-conditioning system so that a temperature of an atmosphere in the optical path is substantially identical to that of an atmosphere around the optical path.

14 Claims, 1 Drawing Sheet

STAGE POSITION MEASURING APPARATUS CAPABLE OF RESTRICTING GENERATION OF TEMPERATURE FLUCTUATIONS TO A MEASURED VALUE

This application is a Continuation of application Ser. No. 08/521,063 filed Aug. 29, 1995, now abandoned.

BACKGROUND OF THE INVENTION

1. Field of the Invention

The present invention relates to a stage position measuring apparatus, and more particularly to a stage position measuring apparatus provided in a projection exposure apparatus for use in manufacturing integrated circuits, liquid crystal bases, thin film magnet heads and the like, and for measuring by means of an optical distance measuring apparatus a position of a stage moving in one or two dimensions and on which a mask or a photosensitive substrate is provided.

2. Related Background Art

In a conventional stage position measuring apparatus, a stage moving in one or two dimensions is mounted within a chamber, and a position of the stage is measured by means of an optical distance measuring apparatus such as a laser interferometer.

The interior of the chamber is air-conditioned in its entirety, and an optical path for the interferometer is locally air-conditioned. More specifically, a local air-conditioning device supplies air to the interferometer optical path through a duct member. The temperature of the air supplied by the local air-conditioning device is identical to the temperature of air supplied by a general air-conditioning device.

In the conventional stage position measuring apparatus as mentioned above, however, an air temperature in the interferometer optical path is different from that of an atmosphere around the interferometer optical path to a certain degree. Such a temperature difference is caused by an offset generated by the influence of a heat generating source such as a stage and the like or by an offset between a controlled overall air-conditioning temperature at which the general air-conditioning device aims and an actual temperature of the atmosphere around the interferometer optical path. The temperature difference is also caused by an offset generated by the influence of heat transmitted from the duct and the like or by an offset between a controlled local air-conditioning temperature at which the local air-conditioning device aims and a temperature of air actually supplied from an air supplying opening for local air-conditioning.

Thus, mixed around the interferometer optical path are the two fluids having the different temperatures or the atmosphere around the interferometer optical path and the air supplied to the interferometer optical path from the air supplying opening for local air-conditioning. Therefore the conventional stage position measuring apparatus has a drawback in that a temperature fluctuation is generated at a value measured by the interferometer due to the mixture of the two fluids having the different temperatures.

SUMMARY OF THE INVENTION

The present invention has been devised in view of the above drawback. An object of the present invention is to provide a stage position measuring apparatus which can restrict the generation of temperature fluctuations to a measured value to thereby enable measurement of a stage position with pinpoint accuracy.

In order to solve the drawback thereof, the present invention provides a stage position measuring apparatus comprising a movable stage which is mounted within a chamber, a system for optically measuring a position of the stage, a system for general air-conditioning of an atmosphere within the chamber, a system for locally air-conditioning an optical path of the measuring system, and a system for controlling the local air-conditioning system so that a temperature of an atmosphere in the optical path is substantially identical to that of an atmosphere around the optical path.

According to a preferred embodiment of the present invention, the controlling system includes a first temperature sensor for measuring the temperature of the atmosphere in the optical path, a second temperature sensor for measuring the temperature of the atmosphere around the optical path, and a system for controlling a temperature of air supplied from the local air-conditioning system so that a measured value of the first temperature sensor is substantially identical to that of the second temperature sensor.

According to another preferred embodiment of the present invention, the second temperature sensor is provided close to the optical path and at a position not facing to an air supplying opening of the local air-conditioning system.

According to another preferred embodiment of the present invention, the stage is movable in two directions, the measuring system includes two optical paths for measuring a position of the stage with respect to each of the two directions, the first temperature sensor includes at least two sensors for measuring a temperature of an atmosphere in each of the two optical paths, and the second temperature sensor includes at least two sensors for measuring a temperature of an atmosphere around each of the two optical paths.

According to another preferred embodiment of the present invention, the controlling system controls the local air-conditioning system on the basis of an average of measured values of the two second temperature sensors.

The stage position measuring apparatus of the present invention controls the local air-conditioning system so that the air temperature in the optical path of the measuring system is substantially identical to the atmospheric temperature around the optical path. Specifically, the air temperature in the optical path is measured, and the atmospheric temperature around the optical path is also measured. Then the temperature of the air supplied from the local air-conditioning system is controlled so that the two measured temperature values are substantially identical to each other.

Thus, such control allows the temperature difference between the atmospheric temperature around the optical path mainly depending on the general air-conditioning system and the air temperature in the optical path depending on the local air-conditioning system to be greatly decreased, thereby restricting temperature fluctuation of a measured position value caused due to mixture of two fluids having different temperatures, and enabling a position of the stage to be measured with pinpoint accuracy.

As stated above, according to the present invention, a stage position measuring apparatus can be provided in which fluctuation of a measured position value due to mixture of two fluids having different temperatures is restricted, and in which a position of the stage is measured with pinpoint accuracy.

DESCRIPTION OF THE PREFERRED EMBODIMENT

Figure 1:
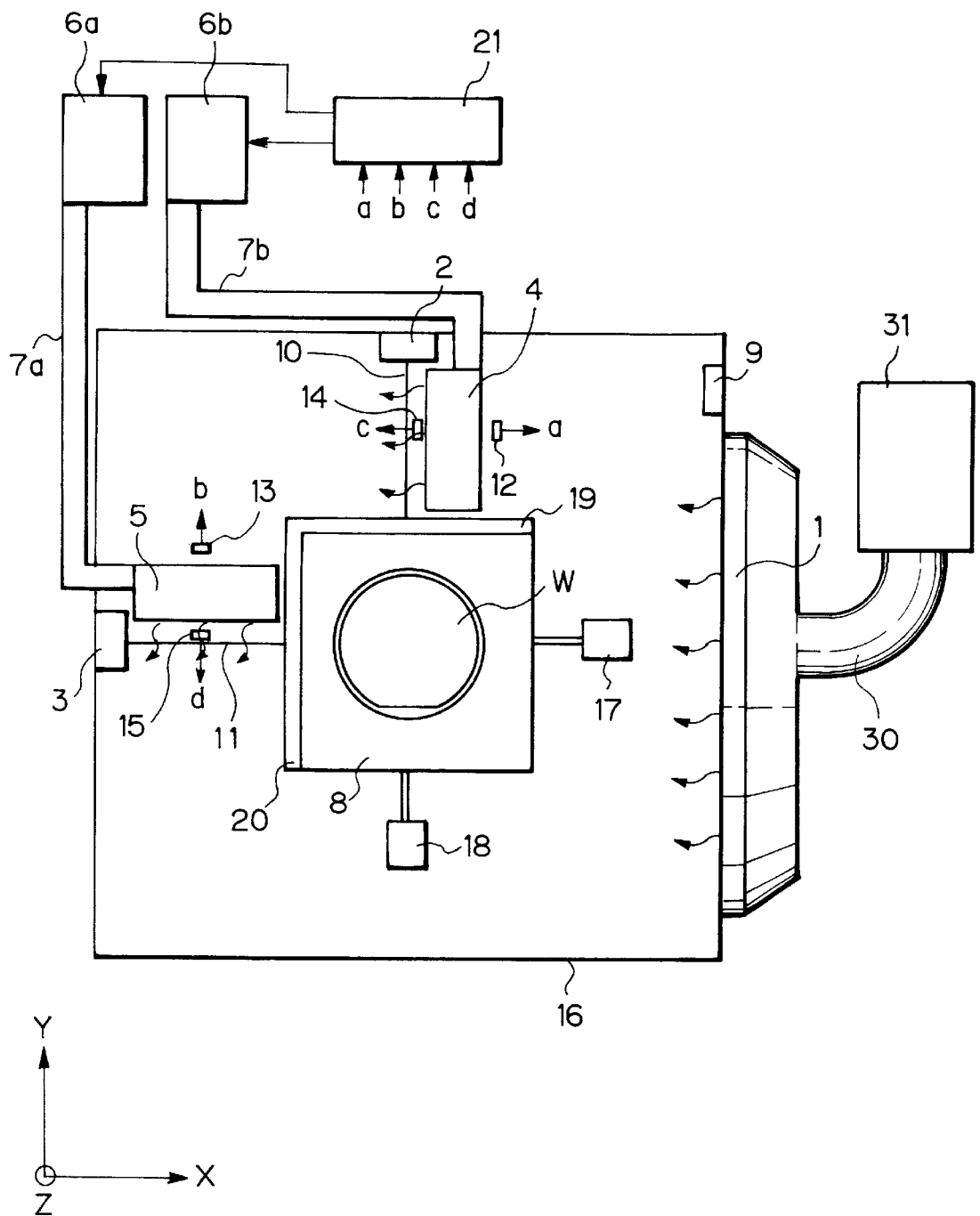
FIG. 1 is a schematic view showing the construction of a stage position measuring apparatus according to an embodiment of the present invention.

An embodiment of the present invention will be explained with reference to the accompanying drawing.

FIG. 1 is a schematic view for showing the construction of a stage position measuring apparatus according to an embodiment of the present invention.

The apparatus shown in the drawing is a partial view of a projection exposure apparatus for focusing and projecting a pattern formed on a mask (not shown) on a wafer W through a projection optical system (not shown), and shows a stage 8 mounted within a chamber 16. The wafer W is rested on the stage 8. The stage 8 is driven in an X-direction by an actuator 17 including a motor, a ball screw and so on. The stage 8 is also driven in a Y-direction by an actuator 18 including a motor, a ball screw and so on. Thus, the stage 8 is movable in two dimensions or in a X and Y plane.

The stage 8 includes thereon a reflecting mirror 19 having a reflecting face which is substantially parallel to an X and Z plane and a reflecting mirror 20 having a reflecting face which is substantially parallel to a Y and Z plane. A laser interferometer 2 is provided in facing relation to the reflecting mirror 19, and a laser interferometer ferometer 3 is provided in facing relation to the reflecting mirror 20.

Thus, a length measuring interference laser beam emitted from the laser interferometer 2 is incident to the reflecting mirror 19 along a Y-direction optical path 10. The laser beam reflected by the reflecting mirror 19 is returned to the laser interferometer 2 along the optical path 10. On the other hand, a length measuring interference laser beam emitted from the laser interferometer 3 is incident to the reflecting mirror 20 along an X-direction optical path 11. The laser beam reflected by the reflecting mirror 20 is returned to the laser interferometer 3 along the optical path 11.

In this way, the laser interferometer 2 measures a displacement of the stage 8 in the Y-direction, and the laser interferometer 3 measures a displacement of the stage 8 in the X-direction. In other words, the laser interferometers 2 and 3 can measure a position of the stage 8 in the X and Y plane. The specific construction and the measuring method of the laser interferometers are disclosed in, for example, U.S. Pat. No. 5,151,749.

The apparatus shown in the drawing also includes an air supplying opening 1 for supplying air having a predetermined temperature into the chamber 16 to air-condition the interior of the chamber 16 in its entirety. The air supplying opening 1 is connected to a general air-conditioning blower 31 through a duct member 30. A temperature of the air supplied from the opening 1 into the chamber 16 is measured by a temperature sensor 9 positioned closely to the opening 1. The blower 31 is appropriately controlled so that a temperature measured by the sensor 9 is identical to a predetermined temperature.

The apparatus shown in the drawing also includes an air supplying opening 4 for supplying air having a predetermined temperature to air-condition the optical path 10 and an air supplying opening 5 for supplying air having a predetermined temperature to air-condition the optical path 11. The opening 4 is connected to a blower 6b through a duct member 7b. On the other hand, the opening 5 is connected to a blower 6a through a duct member 7a.

A temperature of the air supplied from the opening 4 to the optical path 10 is measured by a temperature sensor 14 positioned closely to the blower outlet of the opening 4. On the other hand, a temperature of the air supplied from the opening 5 to the optical path 11 is measured by a temperature sensor 15 positioned closely to the blower outlet of the opening 5. In FIG. 1, the openings 4 and 5 supply the air flows in directions crossing the optical paths of the interferometers, respectively. The openings 4 and 5 may supply the air flows along the optical paths of the interferometers, respectively.

A temperature sensor 12 for measuring a temperature of an atmosphere around the optical path 10 and a temperature sensor 13 for measuring a temperature of an atmosphere around the optical path 11 are provided. The temperature sensors 12 and 13 are disposed at positions in which they are close to the optical paths 10 and 11 and hardly receive any influence from the air flows supplied from the openings 4 and 5, respectively. For example, the temperature sensors 12 and 13 are arranged opposite to the blower outlets of the openings 4 and 5 as shown in the drawing, respectively.

The blowers 6a and 6b are controlled by a controller 21.

The operation of the stage position measuring apparatus according to the embodiment constructed as stated above will be explained.

As mentioned above, the interior of the chamber 16 is air-conditioned in its entirety by the air having a predetermined temperature supplied from the air supplying opening 1. However, since there is a heat generating source such as the stage 8 within the chamber 16, the air within the chamber 16 has a higher temperature distribution than the predetermined temperature to a certain degree. The temperature sensor 12 measures an atmospheric temperature around the optical path 10 and supplies the measured value to the controller 21 as temperature information (a). The temperature sensor 13 measures an atmospheric temperature around the optical path 11 and supplies the measured value to the controller 21 as temperature information (b).

On the other hand, the optical paths 10 and 11 are locally air-conditioned by the air flows supplied from the openings 4 and 5, respectively. Influence such as heat transmission from the duct 7b causes to a certain degree a difference in temperature between air sent by the blower 6b and air actually supplied from the opening 4 to the optical path 10. The influence such as heat transmission from the duct 7a also causes to a certain degree a difference in temperature between air sent by the blower 6a and air actually supplied from the opening 5 to the optical path 11. The temperature sensor 14 measures a temperature of the air supplied from the opening 4 and supplies the measured value to the controller 21 as temperature information (c). The temperature sensor 15 measures a temperature of the air supplied from the opening 5 and supplies the measured value to the controller 21 as temperature information (d).

The controller 21 controls the blower 6a so that the atmospheric temperature around the optical path 10 is substantially identical to the temperature of the air supplied to the optical path 10 or the temperature information (a) is substantially identical to the temperature information (c). The controller 21 also controls the blower 6b so that the atmospheric temperature around the optical path 11 is substantially identical to the temperature of the air supplied to the optical path 11 or the temperature information (b) is substantially identical to the temperature information (d).

Thus, the air temperatures in the optical paths 10 and 11 are substantially identical to the atmospheric temperatures around the optical paths 10 and 11, respectively, thereby substantially preventing two fluids with different temperatures from mixing around the optical paths 10 and 11. As a result fluctuation of a measured position value (or a measurement error) due to the mixture of the two fluids having the different temperatures can be restricted to measure a position of the stage with pinpoint accuracy.

In the above embodiment, the blowers 6a and 6b are independently controlled relative to each other. If a difference between an atmospheric temperature around the optical path 10 and that around the optical path 11 is not considerable in a system, the blowers 6a and 6b may be controlled as a single unit on the basis of an average temperature of the corresponding temperature information (a) and temperature information (b). In such a system, the two optical paths 10 and 11 may be simultaneously locally air-conditioned by a single blower.

In the above embodiment, a single temperature sensor for measuring an atmospheric temperature is positioned behind each of the local air-conditioning openings. A temperature sensor may be disposed at one side of each of local air-conditioning openings, and another temperature sensor may be disposed at the other side thereof, so that an average of values measured by the two sensors is taken.

In the above embodiment, the air flows are supplied to the optical paths 10 and 11 from the directions crossing relative to the optical paths 10 and 11, respectively. The air flows may be supplied along the optical paths 10 and 11, respectively.

As stated above, in the embodiment, the blowers are controlled to minimize differences between the atmospheric temperatures of the optical paths 10 and 11 of the interferometers and the air temperatures around the optical paths 10 and 11, respectively. Such control can be applied to, for example, a mask stage side of a projection exposure apparatus. Such control can also be applied to both the mask stage side and the wafer stage side thereof.

This kind of projection exposure apparatus includes, as disclosed in U.S. Pat. No. 4,650,983, a focus detecting system for detecting a position of a wafer in height (or a position of a projection optical system in a direction of an optical axis) by emitting light obliquely relative to the wafer rested on a stage to detect a position of the light reflected by the wafer. The above embodiment shows an example in which the present invention is applied to a position measurement in a plane parallel to the stage surface. The present invention can also be applied to a focus detecting system of an obliquely incident type to thereby reduce position measurement error due to mixture of two fluids having different temperatures in the focus detecting system.

What is claimed is:

1. A stage position measuring apparatus comprising:
    a movable stage being mounted within a chamber;
    a measuring system which optically measures a position of the stage;
    a system which generally air-conditions an atmosphere within the chamber;
    a local air-conditioning system which locally air conditions optical paths of said measuring system; and
    a controlling system which controls said local air-conditioning system so that a temperature of an atmosphere in the optical path is substantially identical to that of an atmosphere around the optical path.

2. A stage position measuring apparatus according to claim 1,
    wherein said controlling system includes a first temperature sensor means which measures the temperature of the atmosphere in the optical paths, a second temperature sensor means which measures the temperature of the atmosphere around the optical paths, and a system which controls a temperature of air supplied from said local air-conditioning system so that a measured value of said first temperature sensor means is substantially identical to that of said second temperature sensor means.

3. A stage position measuring apparatus according to claim 2,
    wherein said second temperature sensor means is provided close to the optical paths and at a position not facing to an air supplying opening of said local air-conditioning system.

4. A stage position measuring apparatus according to claim 2,
    wherein said stage is movable in two directions, wherein said optical paths of said measuring system includes two optical paths adapted to measure a position of said stage with respect to each of the two directions,
    wherein said first temperature sensor means includes at least two sensors which measure a temperature of an atmosphere in each of the two optical paths,
    and wherein said second temperature sensor means includes at least two sensors which measure a temperature of an atmosphere around each of the two optical paths.

5. A stage position measuring apparatus according to claim 4,
    wherein said controlling system controls said local air-conditioning system on the basis of an average of measured values of the two second temperature sensors.

6. A method for measuring a position of a stage, comprising the steps of:
    providing a temperature sensor between said stage and a measuring system which optically measures a position of said stage; and
    air-conditioning an optical path of said measuring system on the basis of a measured value of said temperature sensor.

7. A stage position measuring apparatus comprising:
    a movable stage;
    a measuring system which is spaced from said movable stage and optically measures a position of said movable stage;
    an air-conditioning system which air-conditions an optical path of said measuring system;
    a temperature sensor provided between said stage and said measuring system; and
    a controller which controls said air-conditioning system on the basis of a measured value of said sensor.

8. A stage position measuring apparatus according to claim 7, wherein said temperature sensor includes a first sensor provided around the optical path of said measuring system, and
    wherein said controller controls said air-conditioning system on the basis of a measured value of said first sensor.

9. A stage position measuring apparatus according to claim 7, wherein said temperature sensor includes a second sensor provided at a position not facing an air-supplying opening of said air-conditioning system, and
    wherein said controller controls said air-conditioning system on the basis of a measured value of said second sensor.

10. A stage position measuring apparatus comprising:
    a movable stage;

a measuring device which is optically coupled to said movable stage to measure a position of said movable stage;

an air-conditioner which supplies air to an optical path of said measuring device to air-condition said optical path thereof;

a temperature sensor which is provided around said optical path; and a controller which is connected to said air-conditioner to control said air-conditioner on the basis of an output from said temperature sensor.

11. A stage position measuring apparatus according to claim 10, wherein said air-conditioner has an air supplying opening, and wherein said temperature sensor is provided at a position not facing said air supplying opening.

12. A stage position measuring apparatus according to claim 10, wherein said temperature sensor is provided between said measuring device and said stage.

13. A method for making a stage position measuring apparatus, comprising the steps of:

providing a movable stage;

providing a measuring system, which is spaced from said movable stage and optically measures a position of said movable stage;

providing an air-conditioning system, which air-conditions an optical path of said measuring system;

providing a temperature sensor which is provided between said stage and said measuring system; and providing a controller which controls said air-conditioning system on the basis of a measured value of said temperature sensor.

14. A method for making an stage position measuring apparatus, comprising the steps of:

providing a movable stage being mounted within a chamber;

providing a measuring system, which optically measures a position of the stage;

providing a system, which generally air-conditions an atmosphere within the chamber;

providing a local air-conditioning system, which locally air-conditions optical paths of said measuring system; and providing a controlling system, which controls said local air-conditioning system so that a temperature of an atmosphere in the optical path is substantially identical to that of an atmosphere around the optical path.

* * * * *